United States Patent [19]

Sumi

[11] Patent Number: 4,989,066
[45] Date of Patent: Jan. 29, 1991

[54] SEMICONDUCTOR PACKAGE

[75] Inventor: Noriaki Sumi, Kanagawa, Japan

[73] Assignee: Mitsubishi Denki Kabushiki Kaisha, Tokyo, Japan

[21] Appl. No.: 468,612

[22] Filed: Jan. 23, 1990

[30] Foreign Application Priority Data

Jan. 26, 1989 [JP] Japan .................................. 1-8059

[51] Int. Cl.$^5$ ...................... H01L 23/48; H01L 23/54
[52] U.S. Cl. ........................................ 357/68; 357/70; 357/74
[58] Field of Search ............................. 357/70, 68, 74; 174/52.4

[56] References Cited

FOREIGN PATENT DOCUMENTS 57-164548  10/1982  Japan ..................................... 357/70
0143246    6/1989   Japan ..................................... 357/70
8605322    9/1986   PCT Int'l Appl. .................... 357/70

OTHER PUBLICATIONS

Nikkei Electronics–Japanese Publications Document Dec. 30, 1985 (p. 61) Fig. 2.

Primary Examiner—Rolf Hille
Assistant Examiner—S. V. Clark
Attorney, Agent, or Firm—Wolf, Greenfield & Sacks

[57] ABSTRACT

A semiconductor package has feed leads each having a pair of recesses to form two pairs of legs.

24 Claims, 2 Drawing Sheets

SEMICONDUCTOR PACKAGE

BACKGROUND OF THE INVENTION

The present invention relates generally to semiconductor packages and, more particularly, to an improvement in the feed leads of a semiconductor package.

A conventional semiconductor package is shown in FIG. 3. A semiconductor chip 1 is secured with a solder 2. Gold wires 5 connect signal leads 3 and a feed lead 4 to the semiconductor chip 1. Plating 6 is provided to give reliable connections between the gold wires 5 and the leads 3 and 4. A seal material 7 is provided to form a package.

In FIG. 4, a layout of pads mounted on a board consists of six pairs of signal pads 8 and a pair of feed pads 9. The semiconductor chip 1 has an integrated circuit and is supplied with power via the feed leads 4 and the gold wires 5. In order to minimize the resistance and thus the voltage drop due to the resistance, the width of the feed leads 4 is made wider than that of the signal leads 3. The width of the feed leads 4, however, is limited in order to prevent the formation of a gap between the feed leads 4 and the seal material 7 because of a difference in thermal expansion between them.

However, in the above semiconductor package, the feed leads are made wide over the entire length from the end secured to the substrate to the end mounted on the board. Consequently, a gap is produced between the seal material and the feed leads because of a difference in the thermal expansion. In addition, the feed pads must be wider than the signal pads so that two types of pads must be designed.

SUMMARY OF THE INVENTION

Accordingly, it is an object of the invention to provide a semiconductor package which not only prevents the formation of a gap between the seal material and the feed leads while maintaining low resistance of the wide feed leads but also enables standardization of mount pads.

According to the invention there is provided a semiconductor package which includes a substantially H-shaped feed lead with the ends of upper legs secured to the substrate.

The above and other objects, features, and advantages of the invention will become more apparent from the following description when taken in conjunction with the accompanying drawings.

DESCRIPTION OF THE PREFERRED EMBODIMENT

Figure 1:
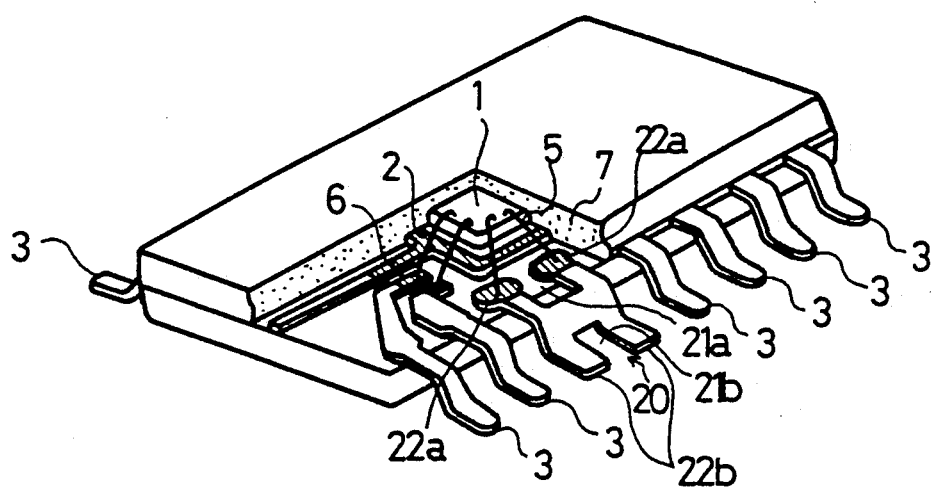
FIG. 1 is a perspective view of a semiconductor package according to an embodiment of the invention.
Figure 2:
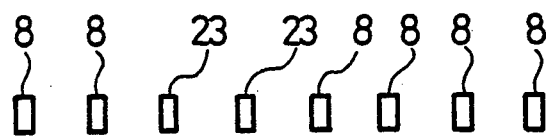
FIG. 2 is a diagram showing how pads are arranged on a board to mount the semiconductor package of FIG. 1.
Figure 2:
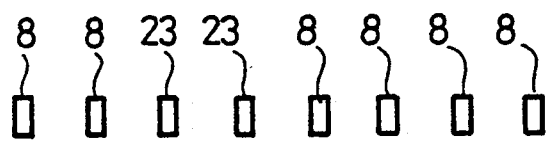
Figure 3:
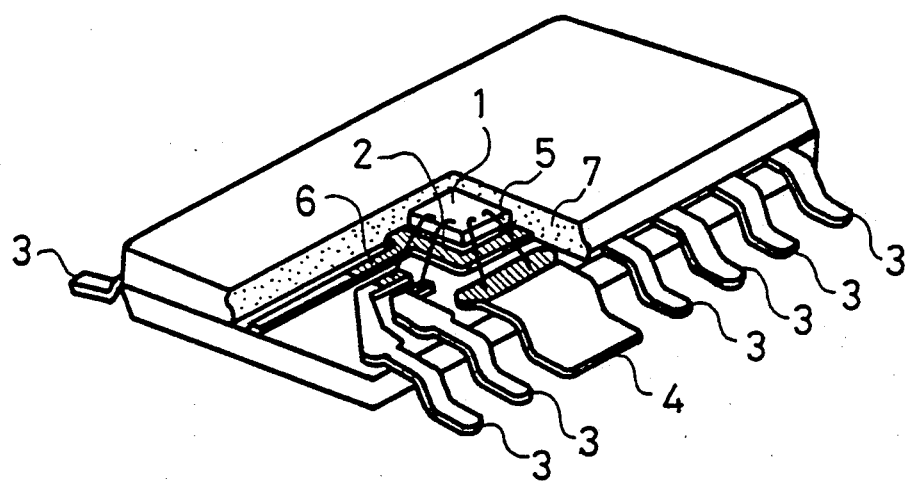
FIG. 3 is a perspective view of a conventional semiconductor package.
Figure 4:
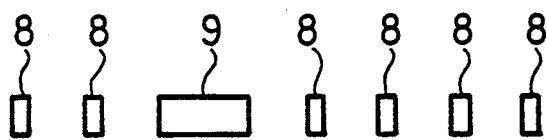
FIG. 4 is a diagram showing how pads are arranged on a board to mount the semiconductor package of FIG. 3.
Figure 4:
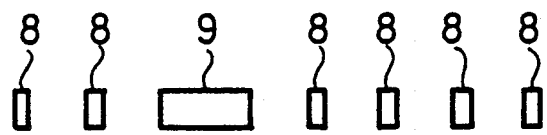

In FIGS. 1 and 2, like reference numerals designate like or corresponding parts of FIGS. 3 and 4. The feed lead 20 is made in the form of a letter "H" by providing recesses 21a and 21b to form a pair of upper legs 22a and a pair of lower legs 22b. The end portions of upper legs 22a are secured to the substrate. The widths of these leg portions are made equal to the widths of end portions of signal leads 3 which are secured to the substrate. The widths of end portions of lower legs 22b mounted on a board are made equal to those of signal legs 3 which are mounted on the board. The feed pads 23 on which the end portions of lower legs 22b are secured are identical with those of the signal pads 8.

In operation, when the width of the central portion is equal to the conventional one, the resistance increases slightly, but this increase is negligible because the wider portion occupies most of the feed lead 20. Since the width of the upper legs 22a is equal to that of the signal lead 3, no gap is produced between the seal material 7 and the upper legs 22a. Since the shape of the mounting pads 23 is identical with that of the mounting pads 8, it is easy to design the pads. The width of upper legs 22a may be slightly different from the width of signal leads 3.

As has been described above, according to the invention, the feed lead is made in the form of a letter "H" so that the separation between the feed lead and the seal material is prevented, thereby enhancing the package reliability. In addition, it enables standardization of mounting pads on a board, thus increasing the productivity of a machine for mounting the semiconductor package.

I claim:

1. A semiconductor component comprising:
   a semiconductor chip;
   a package for housing said semiconductor chip;
   a signal lead projecting from said package; and
   a feed lead projecting from said package, said feed lead having a pair of recesses to form two pairs of legs and a first portion not including said recesses disposed between said pairs of legs, wherein at least one of said pairs of legs extends from said package, and wherein said first portion is disposed outside of said package.

2. The semiconductor package of claim 1, wherein said feed lead is made in the form of a letter "H".

3. The semiconductor package of claim 1, wherein the width of an end portion of said leg to be mounted on a pad is equal to that of said signal lead.

4. In a semiconductor package having a substrate upon which is supported a semiconductor chip and a cover physically connected to said substrate, at least one signal lead, means electrically connecting the signal lead to the semiconductor chip, a feed lead, means electrically connecting the feed lead to the semiconductor chip, said feed lead having means defining a pair of recesses that form respective first and second pairs of legs and a wider portion wider than each of said legs and not including said recesses, wherein said first pair of legs is at least partially disposed between said cover and said substrate, and wherein said wider portion is disposed outside of said cover and said substrate.

5. In a semiconductor package as set forth in claim 4 wherein the pairs of legs extend in opposite direction, one pair for connection to the semiconductor chip and the other pair for mounting on a corresponding pair of pads.

6. In a semiconductor package as set forth in claim 5 wherein the width of a leg of said one pair is substantially equal to the width of a leg of said other pair.

7. In a semiconductor package as set forth in claim 5 wherein the width of the leg of said one pair is substantially equal to the width of a signal lead.

8. In a semiconductor package as set forth in claim 5 wherein the width of the leg of said other pair is substantially equal to the width of a signal lead.

9. In a semiconductor package as set forth in claim 4 in combination with pads upon which the leads are mounted, said pads for receiving signal leads being of the same width as the pads for receiving each leg of the feed lead.

10. In a semiconductor package as set forth in claim 4 wherein said feed lead is of H-shape.

11. In a semiconductor package as set forth in claim 4 wherein the width of an end portion of the leg to be mounted on a pad is equal to that of said signal lead.

12. The semiconductor package of claim 1, wherein said first portion is disposed between said pairs of legs.

13. The semiconductor package of claim 1, wherein:
said first portion is wider than said signal lead; and
said first portion is wider than each of said one of said pairs of legs,
whereby said first portion has greater conductivity than said signal lead.

14. The semiconductor package of claim 13, wherein said first portion is disposed between said pairs of legs.

15. The semiconductor package of claim 13, wherein the width of the distal end of each of said one of said pairs of legs is substantially equal to a width of said signal lead.

16. The semiconductor package of claim 15, wherein said first portion is disposed between said pairs of legs.

17. In a semiconductor package as set forth in claim 4 wherein said wider portion is disposed between said first and second pairs of legs.

18. In a semiconductor package as set forth in claim 4 wherein said wider portion is wider than said at least one signal lead, whereby said wider portion has greater conductivity than said signal lead.

19. In a semiconductor package as set forth in claim 18 wherein said wider portion is disposed between said first and second pairs of legs.

20. In a semiconductor package as set forth in claim 18 wherein a width of each of said first pair of legs is substantially equal to a width of said signal lead.

21. In a semiconductor package as set forth in claim 20 wherein said wider portion is disposed between said first and second pairs of legs.

22. In a semiconductor package having a substrate upon which is supported a semiconductor chip, at least one signal lead, means electrically connecting the signal lead to the semiconductor chip, a feed lead, means electrically connecting the feed lead to the semiconductor chip, said feed lead having means defining a pair of recesses that form respective first and second pairs of legs and a wider portion that is wider than each of said legs, in combination with pads disposed on the substrate and upon which the leads are respectively mounted, the legs of said first pair of legs being disposed apart the same distance as the spacing between said pads.

23. In a semiconductor package as set forth in claim 22 wherein the pads ar disposed at the edge of the substrate in linear alignment.

24. In a semiconductor package as set forth in claim 23 wherein said wider portion is wider than each of said legs, wherein said first pair of legs is at least partially disposed between said cover and said substrate, and wherein said wider portion is disposed outside of said cover and said substrate.

* * * * *